United States Patent [19]

Ward et al.

[11] Patent Number: 4,556,794
[45] Date of Patent: Dec. 3, 1985

[54] SECONDARY ION COLLECTION AND TRANSPORT SYSTEM FOR ION MICROPROBE

[75] Inventors: James W. Ward, Canoga Park; Herbert Schlanger, Simi Valley; Hugh McNulty, Jr., Santa Monica; Norman W. Parker, Camarillo, all of Calif.

[73] Assignee: Hughes Aircraft Company, El Segundo, Calif.

[21] Appl. No.: 696,616

[22] Filed: Jan. 30, 1985

[51] Int. Cl.$^4$ .................. G01N 23/00; H01J 37/26
[52] U.S. Cl. ................................ 250/309; 250/288; 250/396 R
[58] Field of Search ........... 250/309, 305, 288, 396 R; 313/360.1, 363.1

[56] References Cited

U.S. PATENT DOCUMENTS

| 3,798,447 | 3/1974 | Lanusse et al. | 250/309 |
| 3,805,068 | 4/1974 | Lee | 250/305 |
| 3,845,305 | 10/1974 | Liebl | 250/309 |
| 4,126,781 | 11/1978 | Siegel | 250/305 |
| 4,132,892 | 1/1979 | Wittmaack | 250/309 |
| 4,255,661 | 3/1981 | Liebl | 250/396 R |

OTHER PUBLICATIONS

"Secondary-Ion Collection System for an Ion Microprobe Analyzer of High Mass Resolution", Krohn et al., Rev. of Sci. Inst., vol. 43, No. 12, Dec. 1972, pp. 1771–1772.

Primary Examiner—Bruce C. Anderson
Attorney, Agent, or Firm—Anthony W. Karambelas

[57] ABSTRACT

A secondary ion collection and transport system, for use with an ion microprobe, which is very compact and occupies only a small working distance, thereby enabling the primary ion beam to have a short focal length and high resolution. Ions sputtered from the target surface by the primary beam's impact are collected between two arcuate members having radii of curvature and applied voltages that cause only ions within a specified energy band to be collected. The collected ions are accelerated and focused in a transport section consisting of a plurality of spaced conductive members which are coaxial with and distributed along the desired ion path. Relatively high voltages are applied to alternate transport sections to produce accelerating electric fields sufficient to transport the ions through the section to an ion mass analyzer, while lower voltages are applied to the other transport sections to focus the ions and bring their velocity to a level compatible with the analyzing apparatus.

28 Claims, 4 Drawing Figures

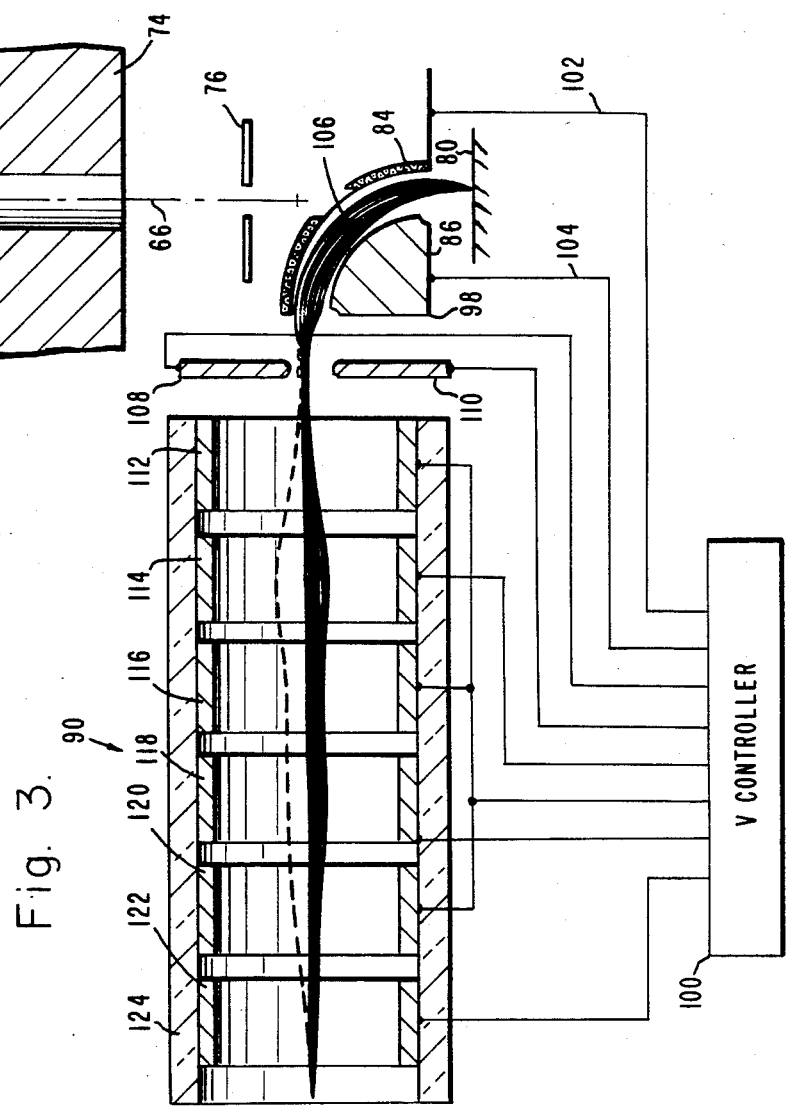

SECONDARY ION COLLECTION AND TRANSPORT SYSTEM FOR ION MICROPROBE

The U.S. Government has rights in this invention pursuant to Contract W-7405-ENG-48 awarded by the Department of Energy for Lawrence Livermore National Laboratory Purchase Order #7255001.

BACKGROUND OF THE INVENTION

This invention relates to ion probe microanalysis, and more particularly, to the collection and transport of ions resulting from the impact of an ion beam on a target surface.

Ion probe microanalysis is a relatively new technique for characterizing solid material samples with high spatial resolution. A number of ion probe analyzers are presently available which operate by bombarding a sample under investigation with energetic heavy ions. This causes secondary atoms and atom clusters, a portion of which are ionized, to be sputtered from the sample. These secondary ions are then analyzed by means of a mass spectrometer. To obtain the necessary ions for analysis, a secondary ion collection system is typically placed between the final lens of the ion beam source and the target surface. The collected secondary ions are then transported to a spectrometer for SIMS (secondary ion mass spectrometry) analysis. The various applications for ion probe microanalyzers include surveying semiconductor doping profiles, failure analysis for electronic devices, characterization of rock samples, analysis of small airborne particles in environmental research, biochemistry and document authentication.

In conventional ion microprobes, the secondary ion collection system is relatively large, and its placement between the final lens of the ion beam source and the target surface requires the final lens to be spaced a substantial distance from the target. This in turn requires the lens to have a long working distance, resulting in lens aberrations which are too large to produce an effective beam probe of submicrometer size. A summary of various available ion probe microanalyzers, including their secondary ion collection and transport systems, is presented in a review article by H. Liebl, "Ion Probe Microanalysis", Journal of Physics E. 16, pages 797–808 (U.K., 1975). These systems are designed to have relatively large working spaces, with an accompanying degradation in the size of the probe beam.

While ion microprobes with a shorter working distance and correspondingly smaller and more accurate beam size can be constructed, the necessary reduction in working space between the final lens and the target surface would rule out the use of most presently available secondary ion collection and transport systems. Existing systems generally use either large magnetic lenses or einzel lenses for secondary ion collection and transport. The magnetic lens systems comprise iron pole pieces with associated windings to provide magnetic fields for moving the secondary ions. Since it is somewhat difficult to transport ions with magnetic fields, relatively large magnetic lens structures are required.

The prior art systems generally use magnetic prism mass analyzers to analyze the collected secondary ions. While these analyzers are suitable for the relatively large scale secondary ion collection and transport systems in use heretofore, they generally occupy too large a space to be compatible with much more compact and higher resolution microprobes. The Liebl review article recognizes the limitations imposed by the large working distances required by conventional secondary ion extraction, and proposes that the secondary ions be extracted backwards through the objective lens (page 805, FIGS. 23≧25). The proposed system, however, requires the use of multiple reflecting surfaces for the secondary ions, and may not impart sufficient energy to the ions to completely extract them from the system for analysis.

SUMMARY OF THE INVENTION

In view of the above problems associated with the prior art, it is a purpose of the present invention to provide a novel and improved secondary ion collection and transport system which is small and compact enough to allow for a short microprobe working distance and an accompanying high quality beam, and yet provides sufficient energization and focusing to transport the secondary ions away from the primary beam area for analysis.

Another purpose of the invention is the provision of a novel and improved secondary ion collection and transport system which is compatible with an ion analyzer considerably smaller than the magnetic mass analyzers which have been used heretofore.

A further purpose of the invention is the provision of such a system which is also adapted for the collection and transport of secondary electrons separately from the secondary ions.

In the accomplishment of these and other purposes, a secondary ion collection and transport system for an ion microprobe is provided which includes means for collecting secondary ions sputtered from the target area, and for directing the ions into general alignment with a desired transport path. Field members are distributed along the desired ion path for applying alternate accelerating and focusing electrostatic fields to the collected ions, such that the ions are propelled with sufficient velocity to traverse the path and in so doing are formed into a beam. The electrostatic fields are created by applying appropriate electrostatic charges to a plurality of spaced field members which are substantially coaxial with the ion path axis. Specific embodiments for the field members include hollow cylinders and multi-pole devices, such as quadrupoles. Voltages of alternately greater and lesser amounts are applied to the successive members to produce the accelerating and focusing fields.

In the preferred embodiment a substantially greater voltage is applied to the first and some of the intermediate field members and then to the last member, thereby providing sufficient ion velocity to transit the path, but reducing the ion energy at the end of the path to a level compatible with a compact quadrupole ion mass analyzer. A specific embodiment is also described in which the transport system consists of six hollow conductive cylinders approximately 5 mm long and 10 mm in inside diameter. For positive ion collection, electrostatic voltages relative to the collected ion polarity of approximately $-1{,}000$, $+200$, $-1{,}000$, $-100$, $-1{,}000$ and $-20$ volts are applied to the first through sixth cylinders, respectively, which are spaced from each other by approximately 1 mm. (For negative ion collection, all the potentials would be reversed.)

The ion collection means preferably comprises a pair of members having generally concentric, arcuate conductive surfaces which are mutually spaced from each other to form a collection path therebetween. A relatively greater electrostatic voltage is applied to the member having the lesser radius, and a relatively lesser electrostatic voltage is applied to the member having the greater radius to impel ions within a desired energy band toward the desired path. A pair of steering electrodes are also positioned between the arcuate members and the transport cylinders to steer the extracted ions axially through the cylinders. The collection member having the greater radius includes an opening of sufficient size to admit the primary ion beam from the microprobe, the two arcuate members being positioned to allow the primary beam to travel between their opposed conductive surfaces to the target.

These and other features and advantages of the invention will be apparent to those skilled in the art from the following detailed description of specific embodiments, taken together with the accompanying drawings, in which:

DESCRIPTION OF THE DRAWINGS

FIG. 3 is an enlarged sectional view of the ion collection and transport system.

DETAILED DESCRIPTION OF THE PREFERRED EMBODIMENTS

Figure 1:
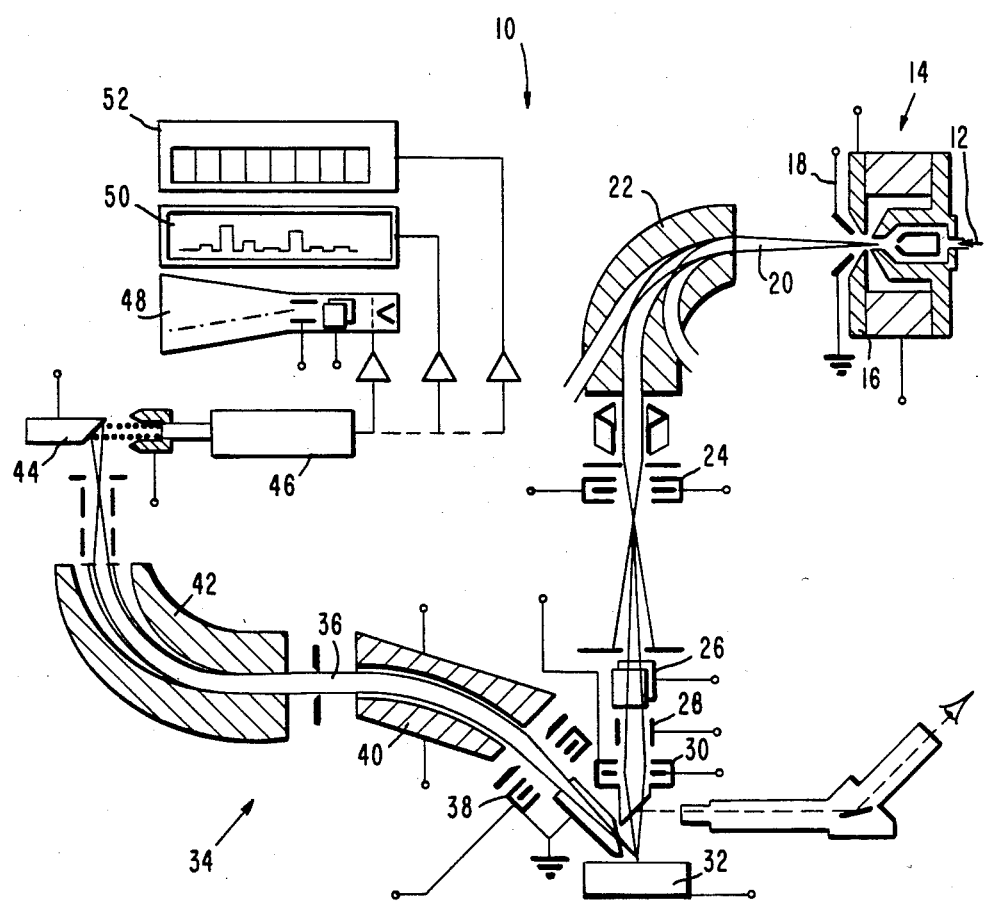
FIG. 1 is a schematic diagram, partly in section, of a prior art ion microprobe mass analyzer, showing a conventional secondary ion collection system.

FIG. 1 depicts an example of a conventional ion microprobe mass analyzer 10, wherein a gas, denoted by arrow 12, enters an ion source 14, such as a duoplasmatron. The ion source includes an anode 16, typically biased at 20 kV, and an extractor 18. The ion source provides a primary beam 20, which enters a primary magnet 22, which selects a particular desired mass and rejects undesired masses. The beam of ions so selected passes through a condenser lens 24, also typically biased at 20 kV, for focusing the primary beam. The ion beam then passes through beam sweep plates 26, 28 and an objective lens 30, typically biased at 14 kV, for focusing the beam into a small spot on a sample 32, which is typically biased at 1.5 kV.

Secondary ions emitted by the sample are collected by a secondary ion collection system 34 and focused into a secondary ion beam 36. The secondary ion beam passes through a focusing lens 38, which is typically biased at 1.5 kV, where the beam is focused into an electric sector 40. The electric sector comprises two portions, one typically biased at $+150$ V and the other at $-150$ V. The electric sector performs energy analysis by selecting a small energy bandwidth and angular distribution of the secondary ions and focuses the secondary ion beam into a secondary magnet 42. The secondary magnet acts as a mass analyzer, separating out ions of a particular mass, which are then directed onto a target 44. Photons emitted by the interaction of the secondary ion beam and the target are collected by a photomultiplier tube 46, the output of which may be distributed to a cathode ray tube 48, a recorder 50 and/or a counter 52. Typically, einzel lenses are employed for the condenser lens 24, the objective lens 30 and the focusing lens 38.

As can be seen from the foregoing description of a typical prior art system, conventional ion beam sources are characterized by a relatively long focal length, a low brightness source, and a low resolution beam at the focal point, which is typically 25 micrometers or greater in diameter. At least one new ion probe is available, however, which produces a considerably shorter, relatively low energy beam with a smaller spot size and greater resolution. However, this probe also allows for much less working space between the probe apparatus and the target surface.

Figure 2:
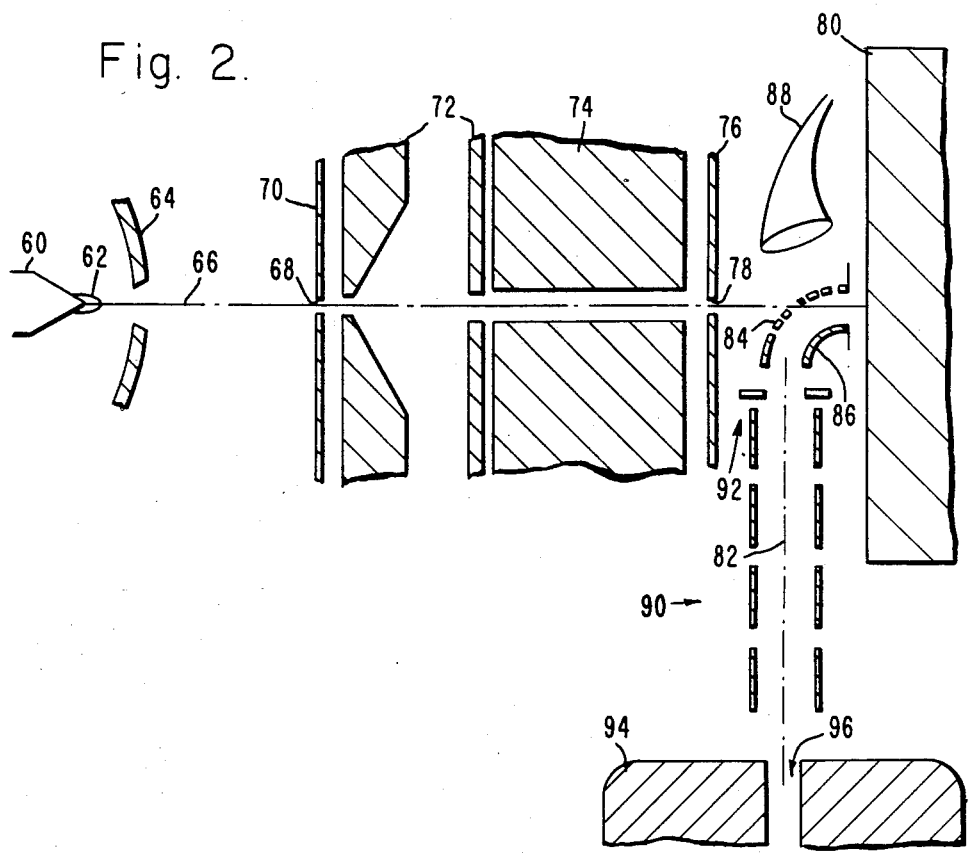
FIG. 2 is a simplified cross-sectional view of an ion microprobe with the secondary ion collection and transport system of the present invention disposed in a small working space between the microprobe and the target surface.

As illustrated in FIG. 2, the probe column of the invention includes an ion beam source 60 with a metal tip 62 which is coated with a liquid metal ion source. A set of extractor electrodes 64 establishes a voltage differential relative to the tip of about 6,000 volts, drawing ions off the tip and initiating a beam 66. The ions are directed through a beam defining aperture 68 in a plate 70, which narrows the beam to reduce aberrations. A Munro lens 72 then accelerates and focuses the beam (an einzel lens could also be used for focusing).

The beam next passes through an octupole 74, which deflects the beam and causes it to scan over an area on the target. The collection and analysis of secondary ions emitted from the target surface during scanning permits the surface characteristics to be mapped. A blanking electrode plate 76 is positioned beyond octupole 74 with a relatively large aperture 78 through which the beam normally passes. By applying a large deflection voltage to the octupole plates 74, the beam can be steered onto the blanking electrode 76, thereby temporarily blocking the beam.

The working distance for the ion probe is defined as the distance between lens 72 and target 80. In addition to the space occupied by a secondary ion collection and transport system, it can be seen that octupole 74 and blanking electrode plate 76, if used, must also fit into this working distance. In an attempt to reduce the working distance, past probes using large secondary ion collection and transport systems sometimes reduced the length of the scanning octupole. However, since the voltage which must be applied to the octupole increases as its length is reduced, substantial reductions in length led to over-voltage problems.

In a typical application of the present invention, target 80 can be positioned about 19 mm from octupole 74, and about 13 mm from blanking electrode plate 76 (FIG. 2 is not to scale). In larger prior art systems, the target would often be tilted at an angle to the probe beam to increase the yield of secondary ions. However, because of the small working distance contemplated by the present invention, any significant tilting of the target is not feasible. Thus, the efficiency of the present secondary ion collection and transport system is quite important.

Secondary ions sputtered from the target surface as a result of the primary beam impact are collected and directed into general alignment with a desired transport path 82 by means of a pair of shaped conductive collection members 84 and 86. The two members have opposed arcuate surfaces which are spaced from each other to form a path for the extraction of secondary ions. The curvatures of the two members are generally concentric, with member 84 describing a larger radius and member 86 a smaller radius. Member 84 extends from a position just off the target surface and above the beam in FIG. 2, and follows a 90° arc which crosses the beam. Member 86 also extends through a 90° arc which is concentric with that of member 84, thereby forming a channel between the opposed surfaces of the two members which is initially perpendicular to the target surface, and curves to a desired path parallel to the target surface. By applying appropriate voltages to the two members of opposite polarity to the collected ions, with a larger voltage applied to member 86 because of its greater degree of curvature, the paths of some of the secondary ions sputtered from the target surface are bent along an arcuate path between the two members, and the ions emerge from between the members in approximate alignment with the desired path 82. Depending upon the degree of curvature of the collection members and the voltage differential between them, the collected secondary ions can be limited to those within a relatively narrow specified energy band.

Arcuate member 84 has an opening of approximately 1 mm diameter, positioned to allow the primary beam 66 to pass through the opening and continue traveling between the two arcuate members to the target. Member 84 is preferably implemented as a conductive mesh material with mesh openings of approximately 0.3 mm. These openings are large enough to permit secondary electrons to travel through the mesh from the beam impact area for collection and analysis by a channeltron 88. The latter device is a conventional high gain detector which can be used to provide a secondary electron video image while the secondary ions are being analyzed.

The secondary ion transport mechanism consists of a plurality of field members, generally indicated by reference numeral 90, which are mutually spaced from each other and distributed along the axis of the desired ion transport path 82. The field members are coaxial with the ion path, and are conductive so as to create electrostatic fields along the ion path as determined by DC voltages applied to each of the members. With an appropriate selection of voltages, it is possible to impart sufficient energy to the ions to transport them along path 82, to focus them, and to have the ions emerge from the transport mechanism with an energy level low enough to be compatible with a compact ion analyzer mechanism.

A pair of electrodes 92 comprising steering electrodes 108, 110 (FIG. 3) is provided between the collection members 84, 86 and the transport assembly 90 to more accurately steer the ions along the desired path. Respective DC voltages are applied to each electrode to obtain the desired steering effect.

The collected and transported ions are then directed to a mass analyzer. The mass analyzer is preferably implemented as a quadrupole 94 having an entrance aperture 96 in alignment with the ion path axis 82, and spaced a short distance from the end of the transport section. A quadrupole is used in this application rather than a more conventional magnetic prism mass spectrometer because the latter devices are too large to be used in the small working distances attained with the invention. However, a quadrupole will not accept ions which are traveling as fast as the ions normally applied to a magnetic prism device. Accordingly, the transport mechanism is specially designed to not only transport and focus the secondary ions, but also to reduce their speed and energy levels upon exit from the transport mechanism to a level compatible with quadrupole 94.

A more detailed presentation of the collection and transport sections is provided in FIG. 3. For purposes of simplification, the mechanical structure supporting the various elements is either not shown or shown only functionally, but the relative dimensions of the ion collection and transport members are to scale. The outer ion collection member 84 through which the primary beam passes is implemented as a thin metallic sheet of mesh which is curved, with respect to an axis extending into the page, 90° along a radius of approximately 7.8 mm. Inner collection member 86, on the other hand, consists of a solid block of metal in the shape of a solid quarter cylinder section, with its outer curved surface describing a 90° arc along a radius of approximately 5.3 mm originating from the central cylinder axis 98. While the opposed surfaces of collection members 84 and 86 are thus both cylindrical about the same axis, the collection members could be implemented with spherical surfaces to effect a greater three-dimensional control over the ion collection.

A voltage controller 100 applies separate DC voltages to collection members 84 and 86 over lines 102 and 104, respectively. For the dimensions shown, in which the lower edges of the collection members are each spaced about 2.5 mm off the surface of target 80, applied voltages of −100 volts and −200 volts on members 84 and 86, respectively, have been found to produce satisfactory results. The path of the ions which are sputtered from the target surface and collected by members 84 and 86 is illustrated by the envelope 106.

It has been observed that secondary ions sputtered from the target surface are characterized by a wide energy distribution, typically from about 1–200 electron volts, with a peak in the vicinity of about 10 eV. A quadrupole mass analyzer, however, only accepts ions within a relatively narrow energy band, such as 5–10 eV. Collection members 84 and 86 are designed so that ions within such an energy band will be transmitted through the collection area to the transport section, while other ions are captured by one or the other of the arcuate members. With the dimensions described above and a 100 volt differential between the two arcuate members, ions with energies above about 10 eV are not deflected sufficiently from their original paths and are captured by outer member 84, while ions with energies of less than about 5 eV are overly deflected and captured by inner member 86. The result is that the remaining ions which are transmitted through the transport section to the quadrupole analyzer fall within an energy range acceptable to the quadrupole. Since the range of energy levels that will be transmitted through the collection apparatus is determined by both the curvature of the collection members and the voltage differential therebetween, the transmitted energy range can be adjusted by an appropriate change in either the geometries or the voltage levels of the arcuate members.

Steering electrodes 108, 110 are positioned beyond the outlet from the collection apparatus so that the collected ions within the desired energy band pass between the electrodes. A DC voltage is applied to each electrode from voltage controller 100 such that the ions are steered more accurately into alignment with their desired path through the transport mechanism. Applied voltages of approximately −200 volts for electrode 108 and −300 volts for electrode 110 have been found suitable for electrodes which are approximately 1 mm wide, spaced about 2 mm from each other, and separated from both the collection and transport sections by about 2.5 mm.

The ion transport apparatus 90 comprises a series of spaced cylindrical sections. In the embodiment shown, six sections 112, 114, 116, 118, 120 and 122 are employed to accomplish the necessary ion acceleration and focusing to successfully transport the ions to the quadrupole analyzer. Electrostatic voltages are applied to each of the cylindrical sections from the voltage controller 100 to set up electrostatic fields along the axes of the sections, the field strengths being sufficient to both transport and focus the ions along the desired path defined by the center lines of the cylinders. Since the cylinder sections are coaxial with the desired ion path, symmetrical cross-sectional field patterns are established.

The various cylindrical transport sections are mounted on an insulative support structure 124. In the preferred embodiment shown, each of the sections are approximately 5 mm long in the axial direction, about 10 mm in inside diameter and axially spaced from each other by about 1 mm. Ion accelerating voltages of approximately $-1,000$ volts are applied to alternate sections 112, 116 and 120, while lower focusing voltages are applied to the other sections. Specifically, voltages of $+200$ volts, $-100$ volts and $-20$ volts are preferably applied by the voltage controller to sections 114, 118 and 122, respectively. Thus, the ions are accelerated to a velocity sufficient to sustain their transport to the quadrupole analyzer by the first and subsequent accelerating sections 112, 116 and 120, while the lower voltages on the other sections serve to focus the ion beam. The voltage applied to the final section 122 is set at relatively low level, which establishes an ion velocity acceptable to the quadrupole. With the alternating accelerating and focusing sections shown, relatively low voltage output ions are obtained in a beam which is still well-focused.

Figure 4:
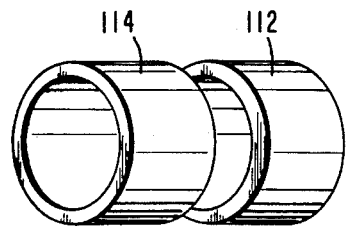
FIG. 4 is a perspective view of two of the ion transport sections.

Turning now to FIG. 4, a perspective view of two of the cylindrical transport sections 112, 114 is provided. In an alternate embodiment, each of the transport sections is implemented as a quadrupole, thus allowing for three-dimensional focusing by applying different voltages to the various poles of each quadrupole.

A secondary ion collection and transport system that requires only a small working distance within an ion microprobe has thus been shown and described. As numerous modifications and alternate embodiments will occur to those skilled in the art, it is intended that the invention be limited only in terms of the appended claims.

What is claimed is:

1. A secondary ion collection and transport system for an ion microprobe, the microprobe directing a primary ion beam onto a target to form secondary ions as a result of the beam's impact, comprising:
   means for collecting secondary ions from the target area and directing the ions into general alignment with a desired transport path;
   a plurality of spaced electric field members distributed along the desired ion path, the field members being adapted to produce electrostatic fields in response to applied electrostatic voltages; and
   means for applying electrostatic voltages to the respective field members such that the ions are alternately accelerated and focused by the electrostatic fields produced by successive members, and emerge from the desired path with a substantially smaller velocity than their maximum velocity during transit along the path.

2. The secondary ion collection and transport system of claim 1, wherein the desired ion path has an axis, each of the field members being substantially coaxial with the ion path axis and mutually spaced in the axial direction.

3. The secondary ion collection and transport system of claim 2, wherein each of the field members comprises a hollow conductive cylinder disposed coaxially with the ion path axis.

4. The secondary ion collection and transport system of claim 2, wherein each of the field members comprises a multi-pole electrostatic device.

5. The secondary ion collection and transport system of claim 2, wherein the voltage applying means applies alternately greater and lesser voltages to the field members to alternately accelerate and focus the ions, with the first member in the direction of ion travel having a substantially greater voltage than the last member.

6. The secondary ion collection and transport system of claim 5, wherein the field members comprise first through sixth members in the direction of ion travel.

7. The secondary ion collection and transport system of claim 6, wherein the voltage applying means applies electrostatic voltages relative to the collected ion polarity of approximately $-1,000$ volts to the first member, $+200$ volts to the second member, $-1,000$ volts to the third member, $-100$ volts to the fourth member, $-1,000$ volts to the fifth member and $-20$ volts to the sixth member.

8. The secondary ion collection and transport system of claim 2, wherein each of the field members is approximately 5 mm long, with inner diameters of approximately 10 mm.

9. The secondary ion collection and transport system of claim 8, wherein adjacent field members are spaced from each other by approximately 1 mm.

10. The secondary ion collection and transport system of claim 1, wherein the ion collection means comprises first and second members having generally concentric, generally arcuate and conductive surfaces adapted to be placed adjacent a target, the conductive surfaces being mutually spaced to form an ion collection path between their arcuate surfaces, and means for applying a relatively greater electrostatic voltage to the member having the lesser radius and a relatively lesser electrostatic voltage to the member having the greater radius, the voltage polarities being opposite to the collected ion polarity.

11. The secondary ion collection and transport system of claim 10, wherein the curvature of the arcuate members and the voltages applied thereto are selected to transmit only ions within a predetermined energy band, and to capture other ions on one or the other of the arcuate members.

12. The secondary ion collection and transport system of claim 11, wherein the arcuate members have radii of approximately 5.3 mm and 7.8 mm, respectively, and the electrostatic voltage means applies a voltage differential of approximately 100 volts across the arcuate members.

13. The secondary ion collection and transport system of claim 10, wherein the arcuate members comprise generally cylindrical sections.

14. The secondary ion collection and transport system of claim 10, wherein the arcuate members comprise generally spherical sections.

15. The secondary ion collection and transport system of claim 10, wherein the greater radius arcuate member includes an opening of sufficient size to admit the primary ion beam, and is positioned to allow the primary beam to travel between the two arcuate members to the target.

16. The secondary ion collection and transport system of claim 15, wherein the greater radius arcuate member comprises a conductive mesh material having mesh openings of approximately 0.3 mm.

17. The secondary ion collection and transport system of claim 10, further comprising a plurality of electrodes positioned about the desired ion transport path between the arcuate members and the field members, and means for applying electrostatic voltages to the electrodes to steer ions emerging from the arcuate members onto the desired path.

18. A secondary ion collection and transport system in an ion microprobe, the microprobe directing a primary ion beam onto a target to form secondary ions as a result of the beam's impact, comprising:
   means for collecting secondary ions from the target area and directing the ions into general alignment with a desired transport path; and
   means distributed along the transport path for applying alternate accelerating and focusing electrostatic fields to the collected ions, the accelerating fields propelling the ions with sufficient velocity to traverse the path, and the focusing fields forming the ions substantially into a beam.

19. The secondary ion collection and transport system of claim 18, wherein the initial field in the ion path imparts a predetermined energy level to the ions, and the last field in the path imparts to the ions a substantially lower energy level than the predetermined level.

20. The secondary ion collection and transport system of claim 19, wherein the transport path has an axis, the distributed field means comprises six conductive members which are substantially symmetrically disposed about the axis and mutually spaced in the direction of ion travel and including means for applying electrostatic voltages relative to the collective ion polarity of approximately: $-1,000$ volts to the first member in the direction of ion travel, $+200$ volts to the second member, $-1,000$ volts to the third member, $-100$ volts to the fourth member, $-1,000$ volts to the fifth member and $-20$ volts to the sixth member.

21. A system for collecting, transporting and focusing secondary ions emitted from a target surface in a small working space, comprising:
   first and second conductive members adapted to be positioned near the target surface, the first and second members having mutually opposed arcuate surfaces defining therebetween an ion collection path;
   means for applying respective electrostatic voltages to the two members of opposite polarity to the ions and of sufficient magnitude to impel ions from the target area within a predetermined energy band along the collection path;
   means for steering the collected ions into alignment with a desired transport path defined by an axis;
   a series of generally annular conductive members spaced along the axis and coaxial therewith; and
   means for applying electrostatic voltages to the successive annular members to establish electrostatic fields along the axis of alternately greater and lesser strengths, the greater fields imparting sufficient energy to the ions to traverse the transport path, and the lesser fields focusing the ions.

22. The system of claim 21, wherein the annular members comprise hollow cylinders.

23. The system of claim 21, wherein the annular members comprise multi-pole electrostatic devices.

24. The system of claim 21, wherein the annular members are approximately 5 mm long axially and having inner diameters of approximately 10 mm.

25. The system of claim 21, including six annular members having voltages applied thereto relative to the ion polarity of approximately: $-1,000$ volts for the first member in the direction of ion travel, $+200$ volts for the second member, $-1,000$ volts for the third member, $-100$ volts for the fourth member, $-1,000$ volts for the fifth member and $-20$ volts for the sixth member.

26. The system of claim 21, wherein the two arcuate members are generally concentric with respective radii of approximately 5.3 mm and 7.8 mm, said electrostatic voltage means applying a voltage differential of approximately 100 volts across the members.

27. The system of claim 21, the two arcuate members being generally concentric, the member having the greater radius comprising a conductive mesh having an opening of sufficient size to admit a primary ion beam and positioned to allow the primary beam to travel between the two arcuate members to the target, and mesh openings of sufficient size to enable the escape through the mesh of ions having an opposite polarity relative to the collected beams.

28. The system of claim 21, said steering means comprising a pair of electrodes disposed on opposite sides of the ions emerging from between the arcuate members, and means for applying a voltage differential across the electrodes to steer the ions along the desired path.

* * * * *